United States Patent
Bhaumik et al.

(10) Patent No.: US 8,994,426 B2
(45) Date of Patent: Mar. 31, 2015

(54) METHOD AND SYSTEMS FOR HIGH-PRECISION PULSE-WIDTH MODULATION

(75) Inventors: Wreeju Bhaumik, Kolkata (IN); Senthil Kumar Devandaya Gopalrao, Madurai (IN)

(73) Assignee: Analog Devices, Inc., Norwood, MA (US)

(*) Notice: Subject to any disclaimer, the term of this patent is extended or adjusted under 35 U.S.C. 154(b) by 105 days.

(21) Appl. No.: 13/600,933

(22) Filed: Aug. 31, 2012

(65) Prior Publication Data

US 2014/0062551 A1 Mar. 6, 2014

(51) Int. Cl.
*H03K 7/08* (2006.01)
*H03K 3/017* (2006.01)
*H03L 7/08* (2006.01)
*H03L 7/081* (2006.01)

(52) U.S. Cl.
CPC ...... *H03K 3/017* (2013.01); *H03L 7/08* (2013.01); *H03K 7/08* (2013.01); *H03L 7/0805* (2013.01); *H03L 7/0814* (2013.01); *H03L 7/0816* (2013.01)
USPC ........... 327/175; 327/149; 327/158; 332/109; 375/238

(58) Field of Classification Search
CPC ................... H03K 5/04–5/06; H03K 7/08
USPC .............. 327/149, 158, 172–176; 375/238; 332/109
See application file for complete search history.

(56) References Cited

U.S. PATENT DOCUMENTS

| | | | | |
|---|---|---|---|---|
| 6,137,328 A | * | 10/2000 | Sung | 327/158 |
| 6,819,190 B2 | * | 11/2004 | Pearce et al. | 331/57 |
| 7,312,668 B2 | * | 12/2007 | Li et al. | 331/57 |
| 7,439,787 B2 | * | 10/2008 | Hashim et al. | 327/172 |
| 7,528,640 B2 | * | 5/2009 | Huang et al. | 327/172 |
| 8,564,345 B2 | * | 10/2013 | Yu | 327/158 |
| 2005/0030206 A1 | * | 2/2005 | Li | 341/53 |

* cited by examiner

*Primary Examiner* — Patrick O'Neill
(74) *Attorney, Agent, or Firm* — Patent Capital Group (57) ABSTRACT

In various embodiments, systems and methods for generating high-precision pulse-width modulation include a delay-locked loop comprising multiple delay units having time-variable delays, control logic for selecting a subset S of the multiple delay units to thereby generate a time-invariant shift amount having a precision finer than that of a system clock and circuitry for applying the shift amount to rising and falling edges of a pulse-width modulation waveform to thereby generate a high-precision pulse-width modulation waveform.

27 Claims, 9 Drawing Sheets

METHOD AND SYSTEMS FOR HIGH-PRECISION PULSE-WIDTH MODULATION

FIELD OF THE INVENTION

In various embodiments, the present invention relates, in general, to pulse-width modulation and, more specifically, to the generation of high-precision pulse-width modulation signals.

BACKGROUND

Figure 1:
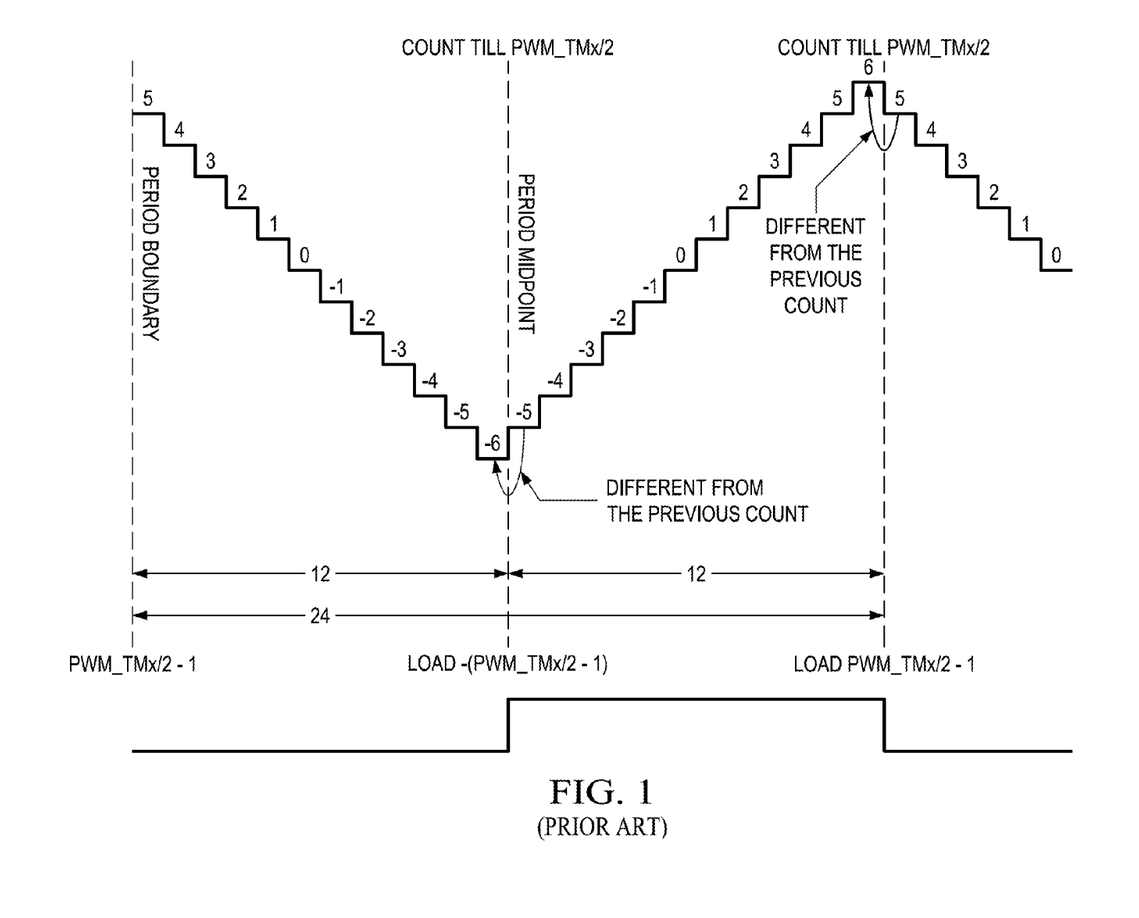
FIG. 1 depicts a conventional PWM signal.

Conventionally, the width of a signal pulse in a digital signal processor ("DSP") or other integrated circuit may be modulated (i.e., varied in width) using a pulse-width modulator ("PWM") circuit that typically includes (i) a synchronous digital counter for generating a count value and (ii) a digital comparator for comparing the generated count value with predetermined/pre-programmed threshold values. Upon detecting that the count has reached a first programmed threshold, a pulse signal (e.g., a voltage or a current signal) is generated and output to a load; the pulse signal is switched off when the comparator detects a count reaching a second programmed threshold, as depicted in FIG. 1. Accordingly, the pulse width (or step size) of the signal is modulated by the counter and the comparator.

Because the counter for conventional PWM functions at a frequency determined by the cycle time of a system clock, the resolution of the conventional PWM is limited by a single period, $T_{sclk}$, of the system clock. For example, the maximum frequency of the system clock in current DSPs is roughly 500 MHz (i.e., $T_{sclk}$=2 ns), limiting the resolution of the PWM to 2 ns. A higher resolution (for example, 150 ps), however, may be required for various applications, such as a motor controller, a switched mode power supply controller, an uninterruptible power supply and/or other power conversion applications and/or other applications of integrated circuits where Digital to Analog Converter functionality or PWM functionality is required. Creating a pulse-width resolution of 150 ps by conventional PWM approaches requires a clock frequency of at least 8 GHz; this very high frequency is infeasible, however, due to the power and implementation constraints on typical DSPs.

In one existing system, a high-resolution pulse-width modulation circuit is created based on a micro-edge positioner ("MEP") technology that is capable of positioning an edge of the signal waveform finely on a sub-divided system clock period of a conventional PWM. The step-size (or pulse width) of the high resolution PWM waveform generated using the MEP logic, however, varies depending on the process, voltage and/or temperature of the PWM, and may thus be unreliable. Additionally, the MEP approach disadvantageously requires a periodic software calculation by the user to calibrate the MEP scale factor required to produce the high resolution PWM waveform.

Consequently, there is a need to precisely increase the resolution of the PWM by providing a constant step-size of the PWM waveform without requiring calibrations by the user.

SUMMARY

In various embodiments, the present invention relates to systems and methods for generating high-resolution pulse-width modulation signal using a high-precision control unit that includes a delay-locked loop ("DLL") and control circuitry. The DLL includes a digital delay line that is locked to a system clock by calibrating the delays of individual delay units within a DLL delay line. The control circuitry applies a predetermined, programmed delay time to the output waveform of the conventional PWM based on the calibrated data obtained from the DLL. The DLL may further include an offset delay line that compensates the delay time offset resulting from variations of the process, voltage, and/or temperature of the delay line. Because the delay time generated by the DLL and control circuitry may be a fraction of one system clock period, the resolution of the pulse width is increased. Additionally, the DLL allows a continuous self-calibration of the delay units therein; this eliminates the need for user calibration. In various embodiments, the DLL is split up into multiple stages, each including a separate delay line to generate a different phase shift of the system clock. The multi-stage DLL (or base DLL) may generate a coarse delay time for the PWM waveforms in each PWM channel; multiple PWM channels in a DSP may share the same base DLL. Accordingly, the length of the delay line associated with each channel may be reduced to subsequently finely adjust the delay time of the PWM waveform in each channel. The shared multi-stage DLL thus significantly reduces the length of delay line and the associated chip area in each PWM channel.

Accordingly, in one aspect, the invention pertains to a method for generating high-precision pulse-width modulation. The method includes calibrating a delay line including multiple delay units to a system clock, determining a desired number of partitions of the system clock, mathematically selecting a subset of the partitions, generating a desired shift amount by applying, to the subset of partitions, a calibration code corresponding to the calibrated delay line, and applying the shift amount to rising and falling edges of a low-precision pulse-width modulation waveform to thereby generate a high-precision pulse-width modulation waveform having a precision finer than that of the system clock. Each delay unit may have a delay that may vary with time. In one embodiment, the subset of the partitions corresponds to the desired amount to shift rising and falling edges of a low-precision pulse-width modulation waveform; the shift amount is less than a period of the system clock.

The number of the subset of partitions, for example, may be P out of $2^M$ possible partitions, wherein M is an integer greater than or equal to 1 and P is an integer greater than or equal to 1 but less than or equal to $2^M$. The desired shift amount of P out of $2^M$ partitions of the system clock may be represented using a M-bit digital word stored in a hardware register; the desired shift amount may be maintained even though individual delay units may have delays that may vary with time.

In various embodiments, calibrating the delay line to the system clock includes locking a delay-locked loop to the system clock. The delay-locked loop may store information about the calibration code in a digital hardware register. Additionally, calibrating the delay line may include removing an offset delay of the delay-locked loop. In some embodiments, calibrating the delay line includes selecting n delay units. The shift amount is then generated by truncating a last M number of bits of a multiplication product of the n delay units and P. As a result, the delay line may be continuously calibrated over a period of time to make the desired shift amounts invariant of time.

In some embodiments, the method of generating high-precision pulse-width modulation further includes splitting the delay-locked loop into multiple stages, each stage generating a phase shifted version of a clock cycle. A coarse delay may be generated using the split delay-locked loop controlled by one or more high-order bits of an M bit word. A fine delay may be generated using a second delay-line and a multiplier controlled by one or more low-order bits of the M bit word.

In another aspect, a system for generating high-precision pulse-width modulation includes a delay-locked loop including a plurality of delay units having time-variable delays, control logic for selecting a subset S of the plurality of delay units to thereby generate a time-invariant shift amount having a precision finer than that of the system clock, and circuitry for applying the shift amount to rising and falling edges of a pulse-width modulation waveform to thereby generate a high-precision pulse-width modulation waveform. In one implementation, the delay-locked loop that may be integrated on a chip is locked to a system clock. In some embodiments, the system may include a digital counter for controlling a delay of the delay-locked loop.

In various embodiments, the desired time-invariant shift amount is represented by P out of $2^M$ partitions of the system clock, and the shift amount is represented by a M bit word. The control logic may include a multiplier to multiply the number S with the number P. Additionally, the control logic may include a truncating circuit to truncate M bits of a multiplication product to derive the subset S of the variable delay units. The shift amount generated may thus be invariant (within M bit precision limits) of process, voltage and temperature by continuously computing the subset S.

The delay-locked loop may include an offset delay line for removing an offset delay of the delay-locked loop. The control logic may include a control register that provides a binary representation of the number S of the delay units whose cumulative delay is equal to one system clock period. In some embodiments, the delay-locked loop is split into multiple stages, each stage generating a phase shifted version of a clock cycle. In one implementation, the stages of the split delay-locked loop are controlled by one or more high-order bit of an M bit word representing P out of $2^M$ partitions of the system clock. Additionally, the system may include (i) a second delay line identical to that within the delay locked loop and (ii) a multiplier controlled by one or more low-order bit of an M bit word representing P out of $2^M$ partitions of the system clock to achieve a high precision of the pulse-width modulation. The system may further include multiple high-precision channels, each having its own delay line, sharing the same delay-locked loop. In one embodiment, the trailing edge of the pulse width modulated waveform input to the system is advanced by one system clock cycle to enable the trailing edge of the high precision output to be pulled in with respect to the original pulse width modulated waveform.

As used herein, the term "high-precision" refers to a resolution of less than one period of a system clock. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which.

DETAILED DESCRIPTION

Figure 2A:
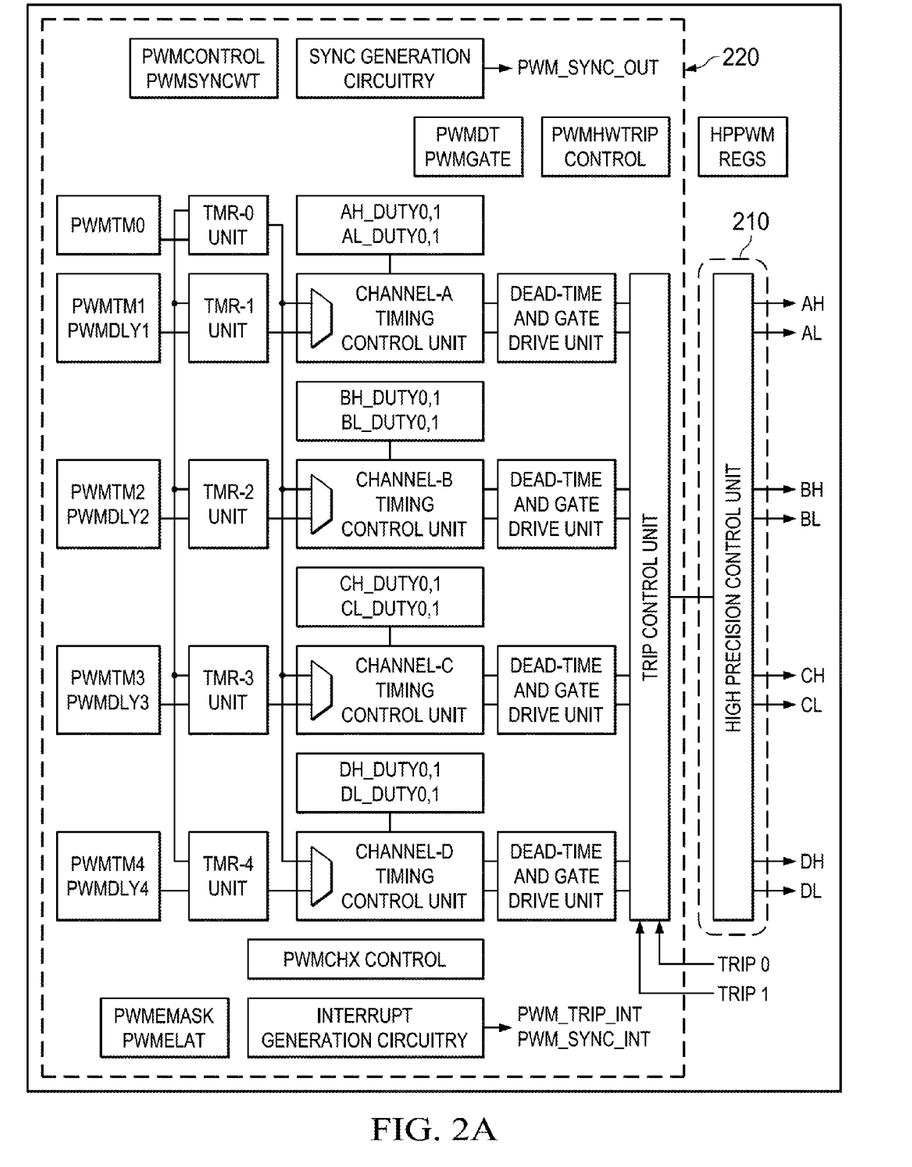
FIGS. 2A and 2B depicts a PWM circuit having a high-precision control unit in accordance with an embodiment of the invention.
Figure 2B:
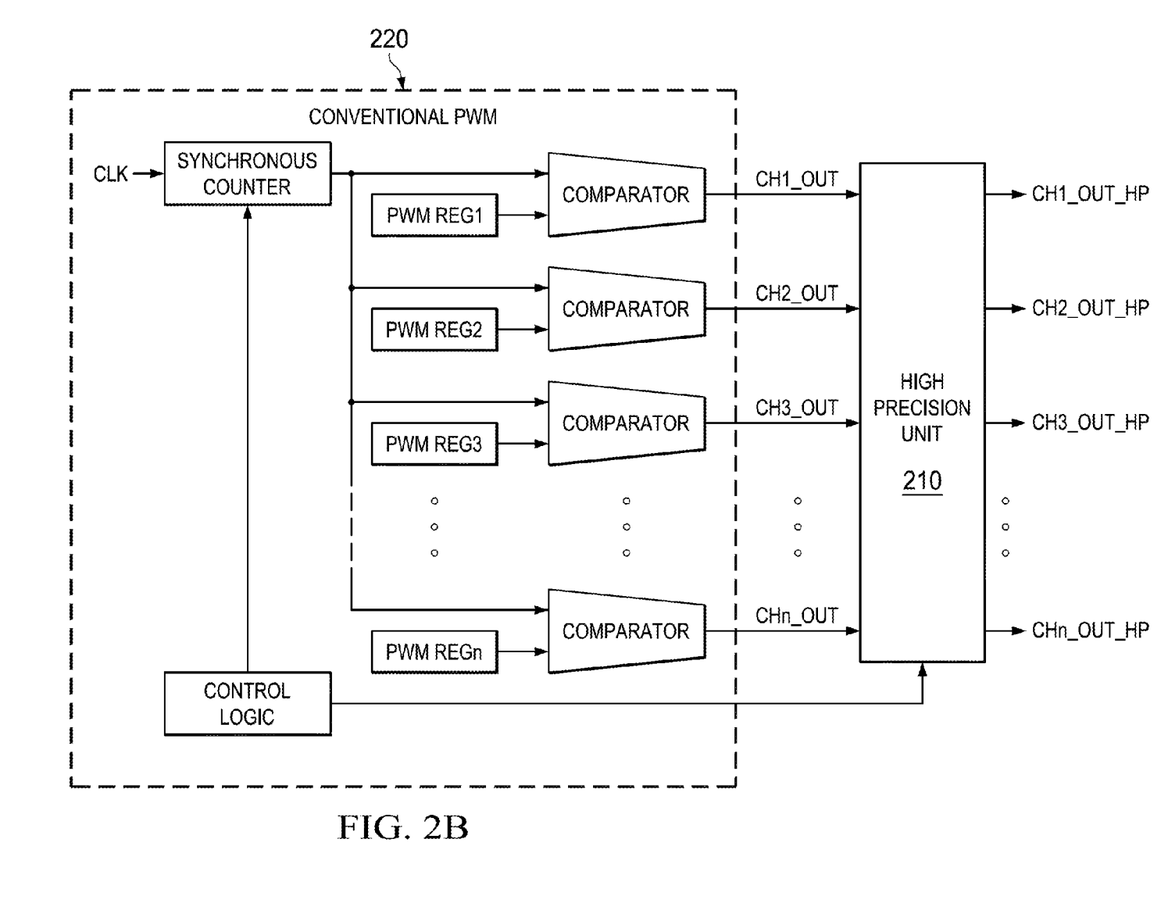
Figure 3:
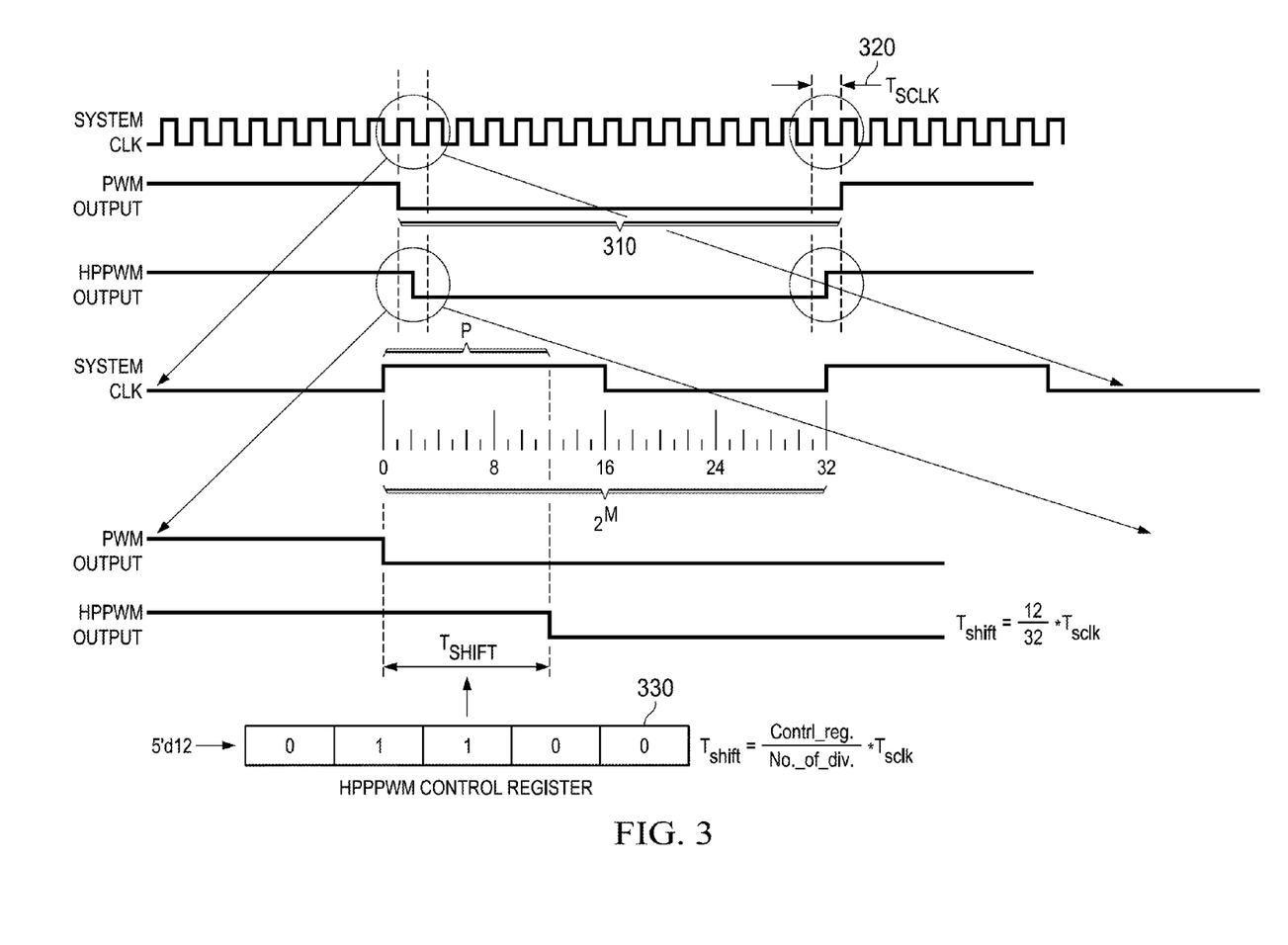
FIG. 3 illustrates a timing diagram of PWM signals in accordance with an embodiment of the invention.

Referring first to FIGS. 2A and 2B, a high-precision control unit 210 achieves high-precision pulse-width modulation by controlling a low-precision PWM unit 220. The PWM unit 220 provides a lower resolution of the PWM waveform; the high-precision control unit 210 receives the low-resolution PWM waveform and outputs a high-resolution PWM waveform. For example, referring to FIG. 3, the pulse width (or the step-size) 310 of the conventional PWM output is $w_1 \times T_{sclk}$, where $w_1$ is an integer; the resolution of the conventional pulse-width modulation waveform is thus one period of the system clock cycle, i.e., $T_{sclk}$. In other words, because the output of the low-precision PWM unit 220 is derived only from edges of the system clock, it is limited in its precision by those available edges. In embodiments of the present invention, however, the high-precision control unit 210 divides the system clock period 320 into a plurality of smaller partitions (for example, $2^M$ partitions) and shifts the output waveform of the PWM unit 220 to the $p^{th}$ division of the $2^M$ partitions using, for example, a control register 330. As a result, the pulse width of the high precision PWM waveform is $$\left(w_2 + \frac{p}{2^M}\right) \times T_{sclk},$$

where $w_2$, p and M are integers ($1 \leq p \leq 2^M$ and $1 \leq M$) and $$\frac{p}{2^M}$$

denotes a delay time that is a fraction of one system clock period. Accordingly, the PWM waveform is shifted by a time, $T_{shift}$, that is less than a period of the system clock $$\left(\text{where } T_{shift} = \frac{p}{2^M} \times T_{sclk}\right),$$

and the resolution of the high precision PWM is thereby increased to $$\frac{1}{2^M} \times T_{sclk}.$$

Figure 4:
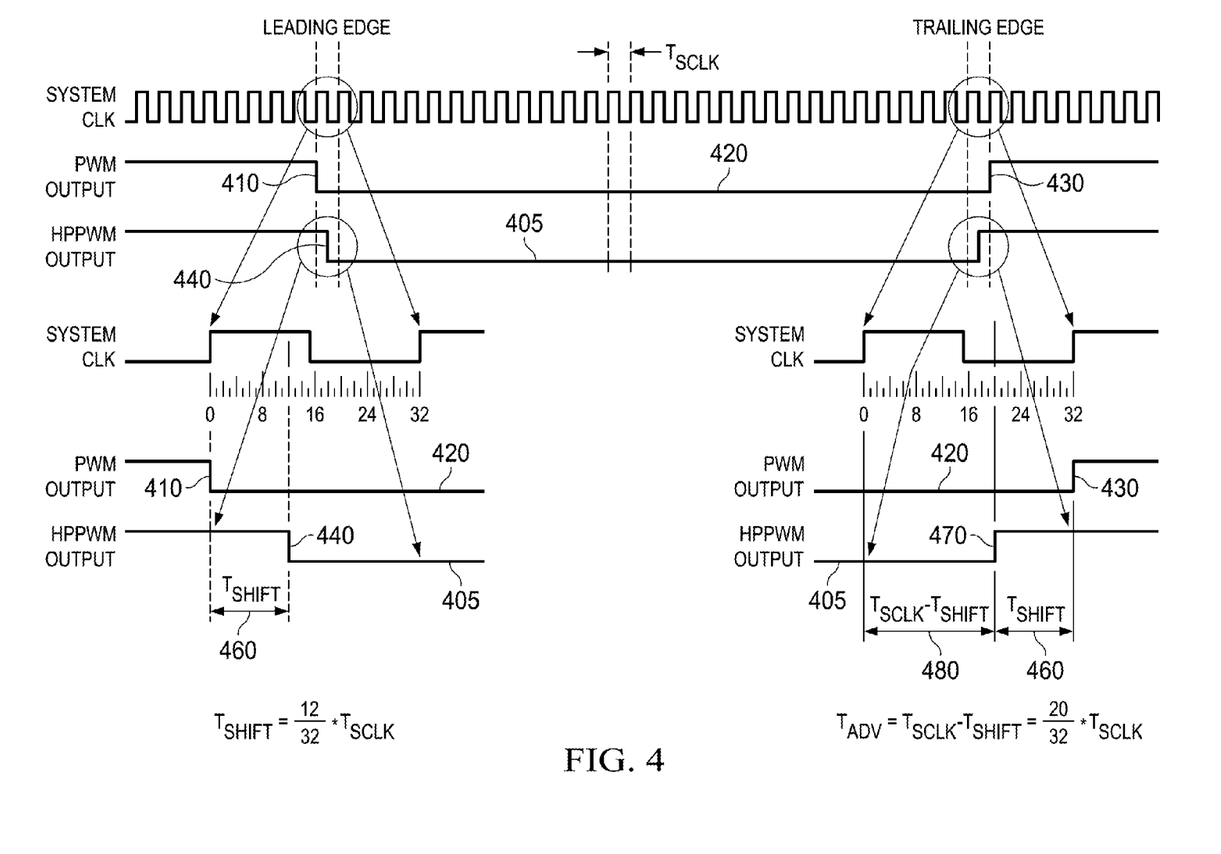
FIG. 4 illustrates modulation of the leading and trailing edges of the high-precision PWM waveform in accordance with an embodiment of the invention.

With reference to FIG. 4, in some embodiments, a high-precision PWM signal 405 is generated by adding a delay time to a leading edge 410 of the low-precision output waveform 420 of the PWM unit 220 and subtracting that same delay time to a falling edge 430 of the low-precision output waveform 420. In one embodiment, the added and subtracted delay times are exactly equal (or nearly exactly equal, e.g., exact within a precision requirement of a given system). For example, the leading edge 440 of the high-precision PWM waveform 450 is delayed (or pushed out) by a period of $T_{shift}$ 460 that is calculated based on p divisions out of the $2^M$ partitions of one system clock period $$\left(\text{i.e., } T_{shift} = \frac{p}{2^M} \times T_{sclk}\right);$$

accordingly, the trailing edge 470 of the high-precision PWM waveform 450 is advanced (i.e., pulled in) also by the period of $T_{shift}$.

Because the high-precision trailing edge 470 of the high-precision PWM waveform 450 occurs earlier in time than the low-precision PWM trailing edge 430, however, in some embodiments, the high-precision trailing edge 470 may be measured from an earlier edge of the low-precision PWM signal 420. For example, the high-precision trailing edge 470 may be generated by modifying the trailing edge 430 of the conventional PWM waveform 420 one cycle earlier than expected and delaying the one-cycle-earlier trailing edge 430 by a period of $T_{adv}$, where $T_{adv}$ is equal to $(2^M-p)$ divisions out of the $2^M$ partitions of one system clock period and can be calculated using $T_{adv}=T_{sclk}-T_{shift}$. The trailing edge 470 thus happens earlier in time by p divisions out of the $2^M$ partitions of one system clock period. In other words, the leading edge 440 and trailing edge 470 are shifted (or delayed) by different (but related) amounts of time; the sum of the delay times of the leading and trailing edges is thus equal to one system clock period. As one of skill in the art will understand, however, other methods of creating the high-precision leading 440 and trailing 470 edges are within the scope of the present invention, and the present invention is not limited to only this embodiment. For example, the amounts that the high-precision leading 440 and trailing 470 edges may be computed separately and held in different registers.

Figure 5:
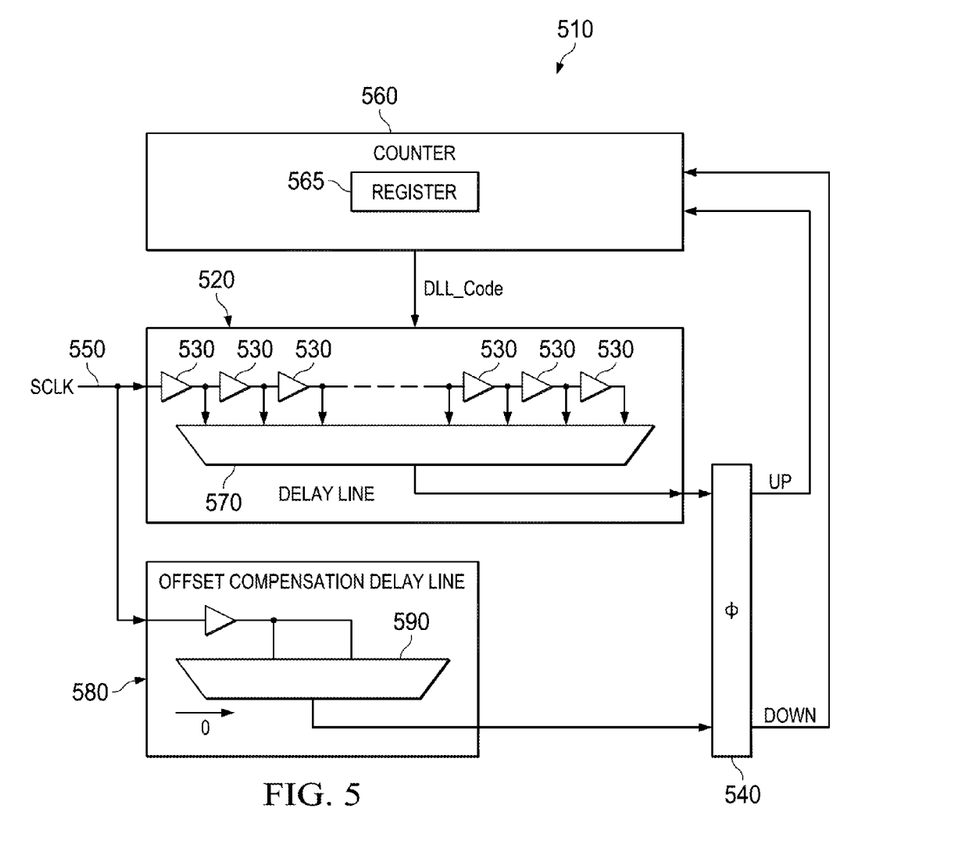
FIG. 5 schematically depicts a DLL structure in accordance with an embodiment of the invention.

Referring to FIG. 5, in various embodiments, the high-precision control unit includes a DLL 510 having a digital delay line 520 that includes a plurality of individual delay units 530, the delay times of which may vary with the time, process, voltage, temperature, and/or other factors. In order to compensate for these potential variations, a phase comparator 540 compares the output of the delay line 520 to an input clock 550. A counter 560 that controls a delay of the DLL 510 is varied based on the output of the phase comparator 540 to speed up or slow down the delay times of each delay unit 530 until the DLL 510 is locked to one cycle of the input clock 550. In one embodiment, the DLL 510 locks itself to the system clock at startup. Because the total delay of the entire delay line 520 is locked to the clock period and the smallest delay time of the DLL 510 is defined as $T_{unit}$, a digital calibrated code (DLL_Code) may be generated to calibrate the delay time of each individual delay unit 530 using Eq. (1).

$$\text{(Calibrated code} \times T_{unit}) + T_{offset} = T_{sclk} \tag{1}$$

where $T_{offset}$ includes the additional delay introduced by a multiplexer 570 in the delay line 520 and the calibrated code (DLL_Code) may be stored by the DLL 510 in a digital hardware register 565. The multiplexer 570 may be used to select one of the outputs of at least one of the delay units 530. Because such additional delays are not deterministic and may depend upon the process, voltage, and/or temperature of the delay line 520, in some embodiments, an offset delay line 580 is incorporated in the DLL 510 to compensate for the additional delay time, i.e., $T_{offset}$. The offset delay line 580 includes a multiplexer 590 comparable to the multiplexer 570 in the delay line 520 and essentially subtracts its non-deterministic delay from the delay line 520. The outputs of the offset delay line 580 and the delay line 520 are fed into the inputs of the phase comparator 540; the phase comparator 540 then removes the additional offset delay. As a result the individual unit delay, $T_{unit}$, may be directly calculated using the calibrated code, as shown it Eq. (2).

$$\text{Calibrated code} \times T_{unit} = T_{sclk} \tag{2}$$

The DLL 510 allows a continuous self-calibration of the delay units 530 over a period of time thereby eliminating the need for user calibration.

Figure 6:
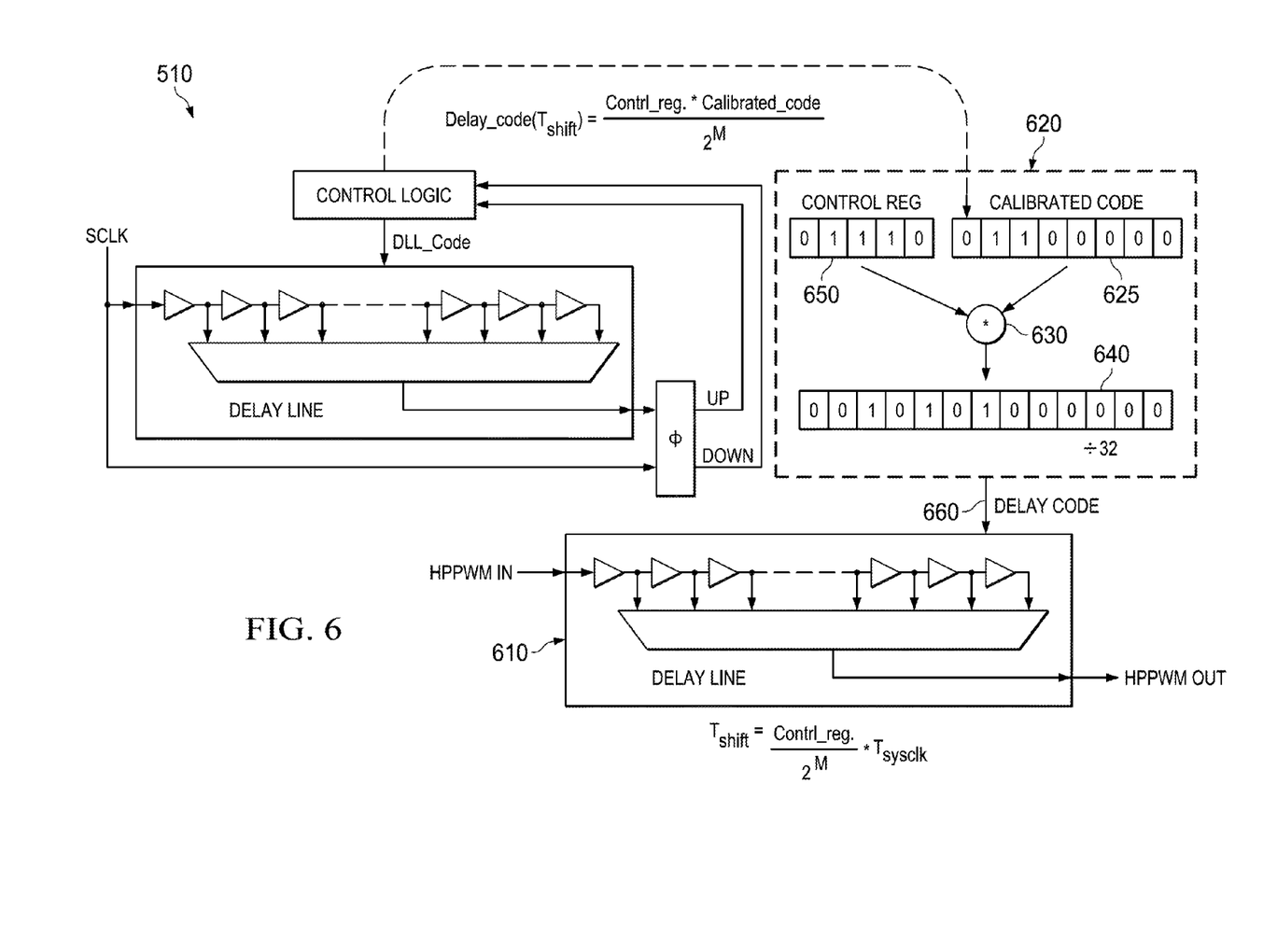
FIG. 6 depicts multiplication and truncation operations of the high precision PWM in accordance with an embodiment of the invention.

Referring to FIG. 6, in various embodiments, the high-precision control unit further includes a delay line 610 and control circuitry 620. The delay line 610 is associated with a PWM channel, where the delay line 610 shifts (or delays) the PWM waveform. Upon obtaining a calibrated code 625 from the DLL 510, which represents the setting required to lock the delay units 530 of the DLL 510 to one clock period, $T_{sclk}$, control circuitry 620 may be activated to produce a precise shift (or delay) based on the obtained calibration data (e.g., calibrated code 625). In one embodiment, the precise delay shifts the PWM waveform by the p divisions out of the $2^M$ partitions of one clock period. In other words, $$T_{shift} = \frac{p}{2^M} \times T_{sclk} = \frac{p}{2^M} \times \text{Calibrated code} \times T_{unit}.$$

The control circuitry 620 may perform two operations: a multiplication operation 630 followed by a truncation operation 640 using a multiplier circuit and a truncating circuit, respectively. In one embodiment, the calibrated code 625 is multiplied by the shift stage number, p, generated from, for example, a control register 650 that includes a binary representation (e.g., a M-bit word stored in a hardware register) of the desired shift stage number. In one embodiment, the multiplication product may be given as: p×Calibrated code. Because the clock period is divided into $2^M$ partitions, the last M bits of the multiplication product are then truncated using, for example, a truncating circuit to perform a division and generate a digital delay code 660 that has the same number of bits as that of the calibrated code. In other words, $$\text{delay code} = \frac{p}{2^M} \times \text{Calibrated code}.$$

The digital delay code 660 may be applied to multiple delay units in the delay line 610 associated with the PWM channel to shift the input of the high precision PWM by p divisions out of the $2^M$ partitions of one system clock period. The generated delay may thus be a fraction of the system clock period; this subdivision of the system clock results in an increased resolution of the high precision PWM output. Additionally, because the delay code is obtained by continuously calibrating the delay units 530 of the DLL 510 over a period of time, the generated shifted delay is invariant of the time, process, voltage, and/or temperature.

Figure 7:
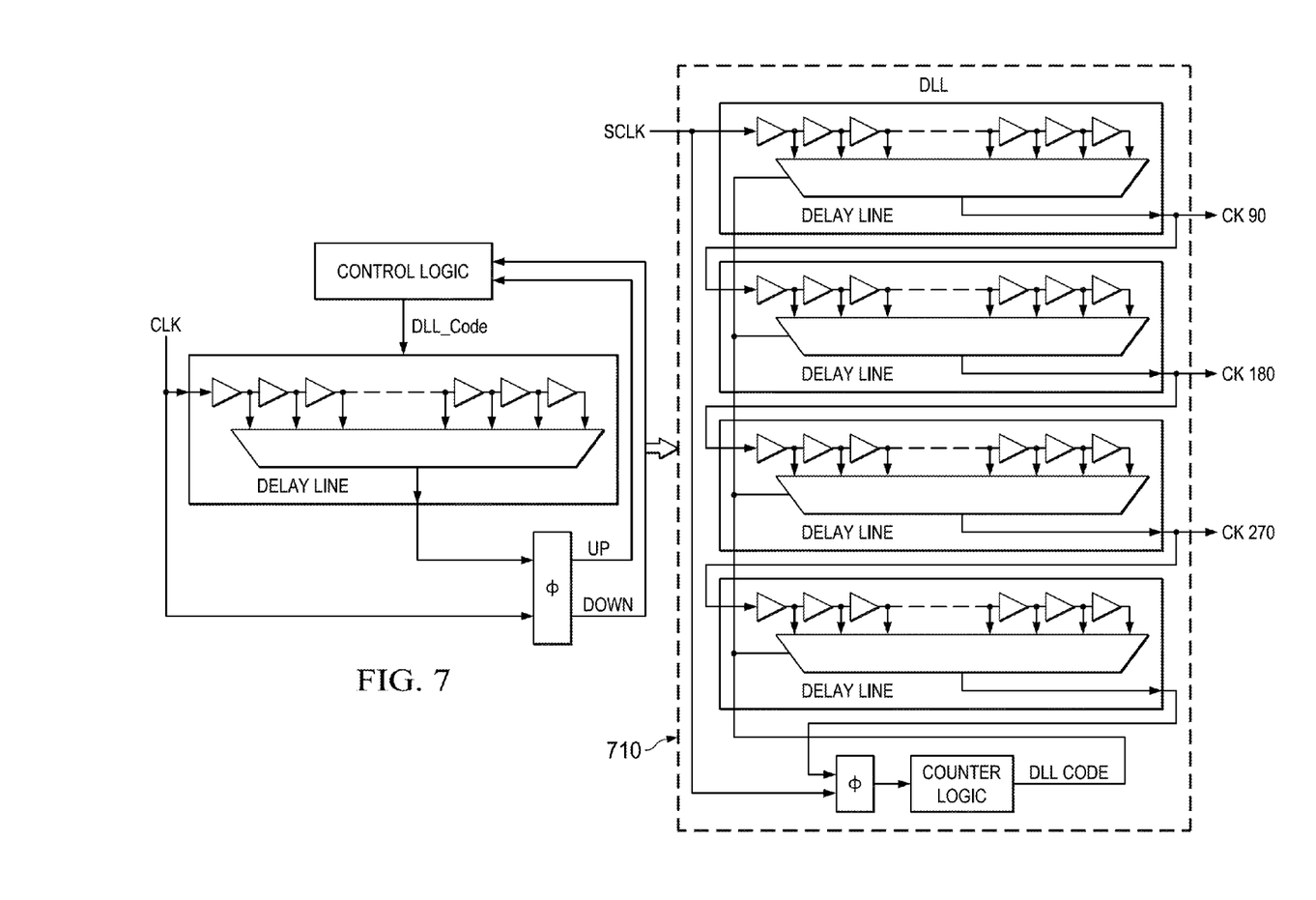
FIG. 7 schematically depicts a multi-stage DLL in accordance with an embodiment of the invention.

Because a DSP typically includes multiple (e.g., between 8 to 16) PWM channels, employing a high precision PWM in each PWM channel may result in increased area requirements for the implemented chip. Additionally, in order to support a wide range of frequencies, especially low-frequency PWM, the length of the delay line (and consequent area) may increase rapidly. In various embodiments, the calibrated DLL, such as the DLL 510, is split up into $2^I$ stages, each stage generating a $(360 \pm 2^I)$ degree phase shift of the system clock signal. For example, referring to FIG. 7, a four-stage DLL 710 (I=2) generates phase shifts of 0, 90, 180, and 270 degrees that correspond to a 0, ¼, ½, and ¾ period delay of the clock cycle, respectively. The multi-stage DLL 710 may serve as a base DLL (a calibrated DLL) that is shared by at least some of the multiple PWM channels to generate a coarse delay time for the PWM waveform in each PWM channel. A delay line implemented in each PWM channel for subsequently finely adjusting the delay time for the PWM waveform therein may have less individual delay units; the delay units in the delay line of each PWM channel may be identical to that in the DLL 710. The shared, multi-stage DLL 710 thus reduces the length of the delay line in each PWM channel and significantly minimizes the chip area occupied thereby. The present invention is not limited to any particular number of DLL stages; any number that is suitable for splitting the DLL and provides phase shifts up to one clock cycle is within the scope of the present invention. For example, the DLL may be split into 8 or 16 stages for a higher number of PWM channels.

Figure 8:
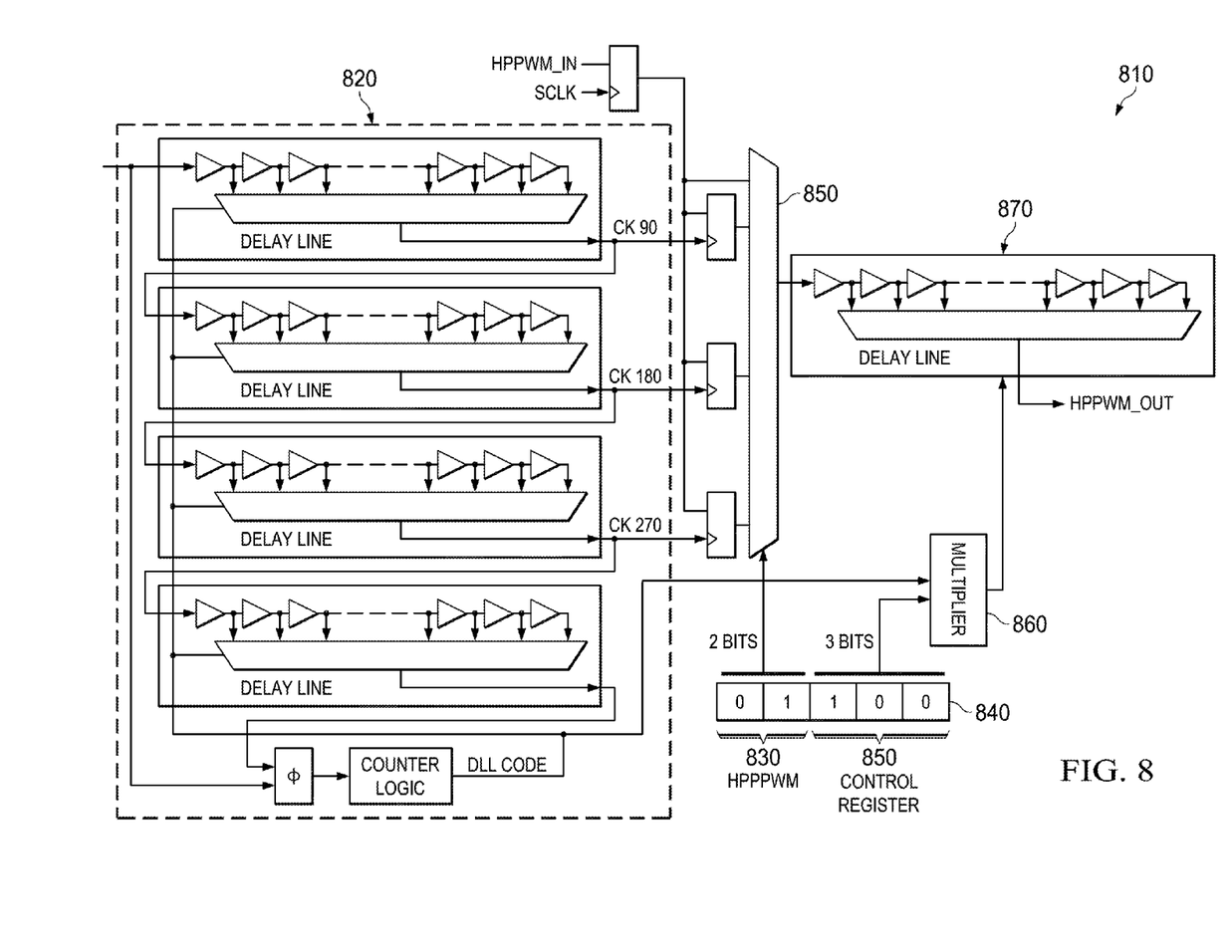
FIG. 8 schematically depicts the circuitry of the high precision control unit in accordance with an embodiment of the invention.

FIG. 8 depicts one embodiment of a complete schematic diagram of the high-precision control unit. In one embodiment, the high-precision control unit 810 is used in a single PWM channel that includes a multi-stage DLL 820 for generating phase-shifted versions of the system clock. The clock phase shifts may be controlled via the first u bits 830 of a control register 840 that provides a binary representation of the desired PWM waveform delay. For example, the first two high-order bits of the control register 840 may be fed to a quadrant multiplexer 850 that selects a stage of the multi-stage DLL 820, and the clock phase shift thereof is applied to generate a coarse delay to the PWM output. The remaining v low-order bits 850 (for example, v=3 in FIG. 8) are then provided to generate a fine delay of the PWM output using a multiplier 860 that multiplies the calibrated code (DLL Code) from multi-stage DLL 820 with the remaining v low-order bits 850 to generate a digital control code (Delay Code), which is applied to a delay line 870 for the PWM channel, containing a shorter delay line in each PWM channel. The DLL 820, the control register 840, the multiplier 860 and/or the delay line 870 associated with the PWM channel may be integrated on a chip. Because the multi-stage DLL 820 may be shared between multiple PWM channels, the occupied area on the chip may be reduced. In some embodiments, the multi-stage DLL 820 allows continuous calibration of the delays provided by the delay units; the entire high precision control nit 810 may thus act as a self-calibrated high precision PWM channel that requires no external calibrations by the user.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for generating high-precision pulse-width modulation, the method comprising:

calibrating a delay line of a delay-locked loop to a system clock according to a calibration code, wherein the delay-locked loop includes a plurality of delay units, each delay unit having a delay that may vary with time;

determining a desired number of partitions of the system clock;

selecting a subset of the partitions, wherein the subset of the partitions corresponds to a desired amount to shift rising and falling edges of a low-precision pulse-width modulation waveform;

generating the desired shift amount by applying a delay code to a delay line associated with a pulse width modulator channel, wherein the delay code is a multiplication product associated with the subset of the partitions and the calibration code corresponding to the calibrated delay line of the delay-locked loop, and further wherein the desired shift amount is less than a period of the system clock; and applying the desired shift amount to rising and falling edges of a low-precision pulse-width modulation waveform to generate a high-precision pulse-width modulation waveform having a precision finer than that of the system clock.

2. The method of claim 1, wherein a number of the subset of partitions is p out of $2^M$ possible partitions, wherein M is an integer greater than or equal to 1 and p is an integer greater than or equal to 1 but less than or equal to $2^M$, and further wherein the delay code is generated by multiplying p by the calibration code.

3. The method of claim 2, wherein the desired shift amount of p out of $2^M$ partitions of the system clock is represented by a M-bit digital word stored in a hardware register.

4. The method of claim 2, wherein the desired shift amount of p out of $2^M$ partitions of the system clock is maintained even though individual delay units may have delays that may vary with time.

5. The method of claim 1, wherein calibrating the delay line to the system clock comprises locking the delay-locked loop to the system clock.

6. The method of claim 5, wherein the delay-locked loop stores information about the calibration code in a digital hardware register.

7. The method of claim 5, further comprising removing an offset delay of the delay-locked loop.

8. The method of claim 1, further comprising splitting the delay-locked loop into a plurality of stages, each stage generating a phase shifted version of a clock cycle.

9. The method of claim 8, further comprising generating a coarse delay using the split delay-locked loop controlled by at least one high-order bit of an M bit word, wherein M is an integer greater than or equal to 1.

10. The method of claim 9, further comprising generating a fine delay by multiplying the calibrated code with at least one low-order bit of the M bit word.

11. The method of claim 1, wherein calibrating the delay line of the delay-locked loop comprises selecting n delay units, wherein n is a number of selected delay units.

12. The method of claim 1, wherein p is a number of the subset of partitions and the shift amount is generated by truncating a last M number of bits of a multiplication product of p and the calibrated code, wherein M is an integer greater than or equal to 1 and p is an integer greater than or equal to 1.

13. The method of claim 12, wherein the delay line is continuously calibrated over a period of time to make the desired shift amounts invariant of time.

14. A system for generating high-precision pulse-width modulation, the system comprising:
- a delay-locked loop comprising a plurality of delay units having time-variable delays, wherein a calibrated code is associated with the delay-locked loop, the calibrated code representing a setting required to lock the delay-locked loop to a system clock;
- control logic for selecting a subset S of a plurality of delay units of a delay line associated with a pulse width modulator channel to generate a time-invariant shift amount, wherein the control logic includes a multiplier for generating a multiplication product based on the calibrated code, wherein the time-invariant shift amount has a precision finer than that of the system clock, wherein S is a number of delay units in the subset; and
- circuitry for applying the time-invariant shift amount to rising and falling edges of a pulse-width modulation waveform to generate a high-precision pulse-width modulation waveform.

15. The system of claim 14, where the desired time-invariant shift amount is represented by p out of $2^M$ partitions of the system clock, and wherein the shift amount is represented by a M bit word, wherein M is an integer greater than or equal to 1 and p is an integer greater than or equal to 1 but less than or equal to $2^M$.

16. The system of claim 15, wherein the multiplier is configured to multiply p by the calibrated code to generate the multiplication product.

17. The system of claim 16, wherein the control logic further comprises a truncating circuit to truncate M bits of the multiplication product from the multiplier to derive the subset S.

18. The system of claim 17, wherein the shift amount generated is invariant (within M bit precision limits) of process, voltage and temperature by continuously computing S in the subset.

19. The system of claim 14, further comprising a digital counter for controlling a delay of the delay-locked loop.

20. The system of claim 14, wherein the delay-locked loop further comprises an offset delay line for removing an offset delay of the delay-locked loop.

21. The system of claim 14, wherein the control logic comprises a control register that provides a binary representation of the number S of the delay units whose cumulative delay is equal to one system clock period.

22. The system of claim 14, wherein the delay-locked loop is split into a plurality of stages, each stage generating a phase shifted version of a clock cycle.

23. The system of claim 22, wherein the stages of the split delay-locked loop are controlled by at least one high-order bit, such that a stage of the delay-locked loop can be selected to apply a respective phase shifted version of the clock cycle to generate a coarse delay for the pulse-width modulation waveform.

24. The system of claim 22, wherein the multiplier is controlled by at least one low-order bit, such that a delay code can be applied to the delay line associated with the pulse width modulator channel to generate a fine delay for the pulse-width modulation waveform.

25. The system of claim 22, further comprising multiple high-precision channels, each having its own delay line, sharing the same delay-locked loop.

26. The system of claim 14, wherein the trailing edge of the pulse width modulated waveform input to the system is advanced by one system clock cycle to enable the trailing edge of the high precision output to be pulled in with respect to the original pulse width modulated waveform.

27. The system of claim 14, wherein the delay-locked loop is integrated on a chip.

* * * * *